US012610460B2

(12) United States Patent
  Chaumeil et al.

(10) Patent No.:  US 12,610,460 B2
(45) Date of Patent:      Apr. 21, 2026

(54) OIL-AIR ELECTRICAL FEEDTHROUGH CIRCUIT BOARD FOR HIGH VOLTAGE GENERATOR

(71) Applicant: GE Precision Healthcare LLC, Waukesha, WI (US)

(72) Inventors: Jonathan Chaumeil, Guyancourt (FR); Christophe Robert, Saint-Remy-lès-Chevreuse (FR); Baptiste Salvi, Saint-Cloud (FR); Nicolas Levilly, Magny-les-Hameaux (FR)

(73) Assignee: GE PRECISION HEALTHCARE LLC, Waukesha, WI (US)

( * ) Notice: Subject to any disclaimer, the term of this patent is extended or adjusted under 35 U.S.C. 154(b) by 226 days.

(21) Appl. No.: 18/618,541

(22) Filed: Mar. 27, 2024

(65) Prior Publication Data

US 2025/0311096 A1      Oct. 2, 2025

(51) Int. Cl.
  *H05K 1/02*      (2006.01)
  *H05G 1/10*      (2006.01)
(52) U.S. Cl.
  CPC ............. *H05K 1/0298* (2013.01); *H05G 1/10* (2013.01); *H05K 1/0215* (2013.01); *H05K 1/0256* (2013.01); *H05K 2201/09327* (2013.01); *H05K 2201/09545* (2013.01); *H05K 2201/2045* (2013.01)

(58) Field of Classification Search
  CPC .. H05K 1/0298; H05K 1/0215; H05K 1/0256; H05K 2201/09327; H05K 2201/09545; H05K 2201/2045; H05K 1/0254; H05K 3/3447; H05G 1/10
  See application file for complete search history.

(56) References Cited

FOREIGN PATENT DOCUMENTS

JP        2002076567  A  *  3/2002
JP            6411647  B2  *  10/2018    ............. H01F 27/14

OTHER PUBLICATIONS

"Djinn Tonix HV Tank," GE HealthCare Website, Available Online at https://services.gehealthcare.com/gehcstorefront/p/5495654, Available as Early as Nov. 26, 2022, 2 pages.
"Djinn Mammo Hvtank Fru," GE HealthCare Website, Available Online at https://services.gehealthcare.com/gehcstorefront/p/5560995, Retrieved Online Mar. 20, 2024, 2 pages.

* cited by examiner

*Primary Examiner* — David J Makiya
*Assistant Examiner* — William Laurence Taylor
(74) *Attorney, Agent, or Firm* — McCoy Russell LLP

(57)      ABSTRACT

Various systems are provided for an electrical feedthrough circuit board for a high voltage tank, comprising a pair of outer signal layers, at least one inner signal layer; wherein the at least one inner signal layer electrically connects an air side of the electrical feedthrough circuit board and an oil side of the electrical feedthrough circuit board. As an example, the high voltage tank may comprise a high voltage tank tubular envelope, a printed circuit board having an oil side and an air side arranged inside the high voltage tank, a pair of O-rings arranged on either side of the printed circuit board, wherein the pair of O-rings surround the oil side of the printed circuit board, and an end plate.

20 Claims, 15 Drawing Sheets

OIL-AIR ELECTRICAL FEEDTHROUGH CIRCUIT BOARD FOR HIGH VOLTAGE GENERATOR

FIELD

Embodiments of the subject matter disclosed herein relate to medical imaging, and more particularly, to x-ray generation.

BACKGROUND

In various imaging systems, an x-ray source emits an x-ray beam toward a subject or object, such as a patient. After attenuation by the subject, the x-ray beam impinges upon a detector array. An intensity of the attenuated beam radiation received at the detector array depends on upon attenuation of the x-ray beam by the subject. Each detector element of the detector array produces a separate electrical signal which is transmitted to a data processing system for analysis and generation of a medical image. A high voltage tank may be integrated with an x-ray generator to generate voltages sufficient for producing x-ray beams. The high voltage tank may be insulated with dielectric oil and plastic parts. Electrical signals of the high voltage tank may travel between an oil side and the air side of the high voltage tank.

BRIEF DESCRIPTION

In one example, a system includes an electrical feedthrough circuit board for a high voltage tank, comprising a pair of outer signal layers, and a pair of inner signal layer; wherein two inner signal layer electrically connects an air side of the electrical feedthrough circuit board and an oil side of the electrical feedthrough circuit board.

The brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present disclosure will be better understood from reading the following description of non-limiting embodiments, with reference to the attached drawings, wherein below.

DETAILED DESCRIPTION

The following description relates to an electrical feedthrough of a high voltage (HV) tank. In particular, the following description relates to an interface board that functions as an electrical feedthrough of the HV tank. Electrical feedthroughs enable signal continuity during transmission of a power signal from an oil side to an air side of a printed circuit board (PCB) of the HV tank. However, existing electrical feedthroughs may compromise sealing of the HV tank, which may lead to oil leaks.

Since dielectric oil provides electrical insulation of electrical components of the HV tank, suppresses corona and arcing, and dissipates heat produced by the electrical components of the HV tank, the performance of the HV tank, and more specifically the electrical components, may decrease because of the oil leaks. To maintain the integrity of the seals of the HV tank and ensure signal continuity, bulkheads may be integrated in the HV tank. Although bulkheads provide many advantages with regards to signal continuity, the bulkheads may be expensive in terms of cost and may have a large footprint. As such, integration of the bulkheads is not cost efficient and are not suitable for a compact HV tank. Thus, the issues described above may be addressed by the interface board with surface metallization on a pair of outer signal layers (e.g., top signal layer and bottom signal layer) of the interface board to ensure sufficient sealing of the HV tank and a pair of inner signal layers that enable signal continuity of the power signal from the oil side to the air side of the interface board. The interface board may include split grommets that support insulation bars and provide a mechanical dampening effect on the insulation bars of a HV transformer assembly positioned in an interior of the HV tank. Additionally, the interface board includes grounding clips that are coupled to various components of the HV transformer assembly to ground the various components such as the shielding of the coaxial signal cables.

Figure 1:
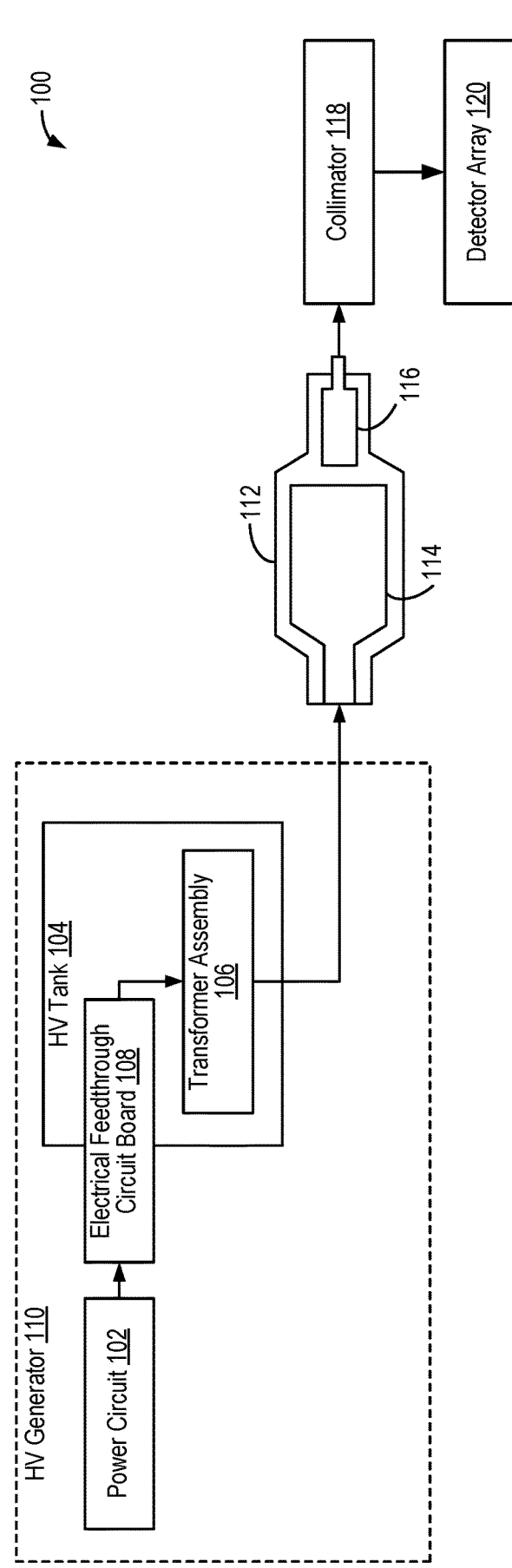
FIG. 1. shows a block diagram schematic of an x-ray generation and detection system.
Figure 2:
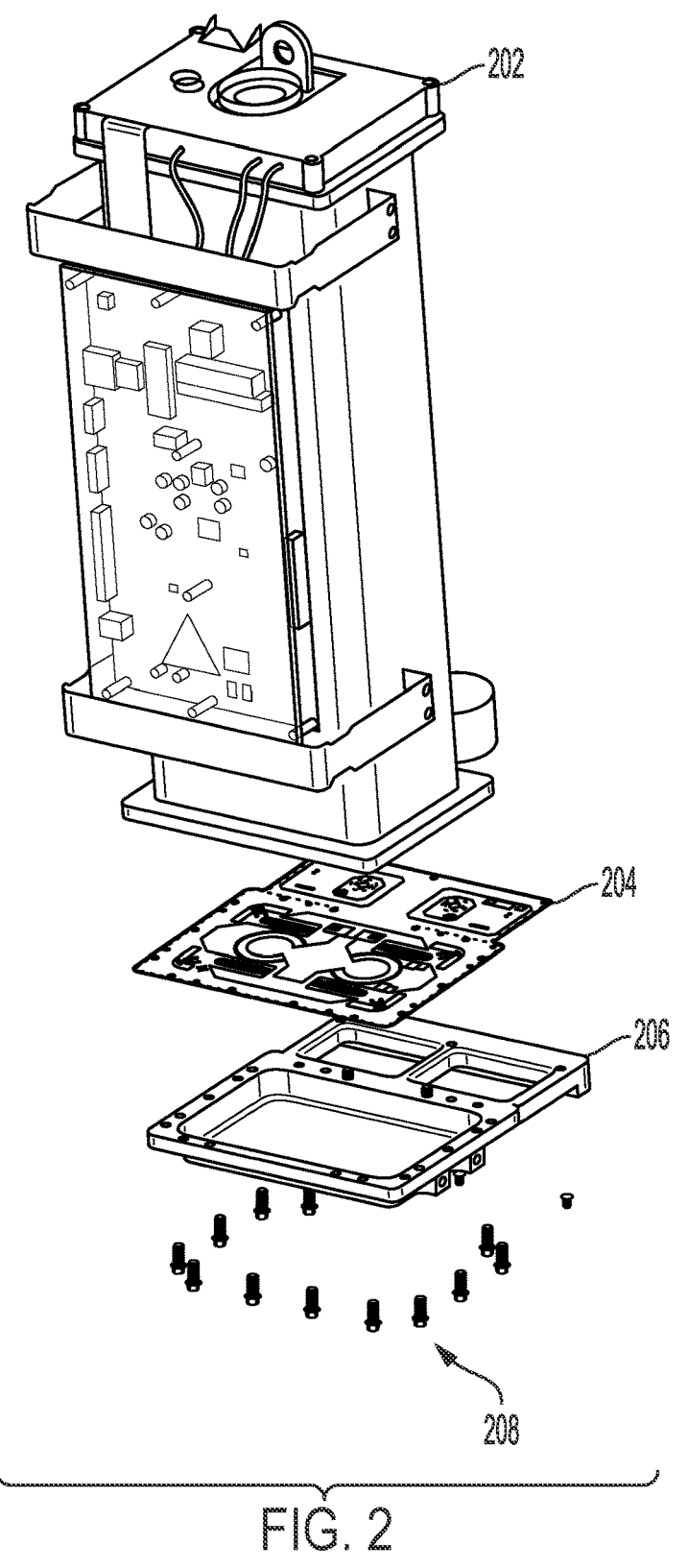
FIG. 2 shows a pictorial view of a high voltage (HV) tank that incorporates disclosed embodiments.
Figure 3:
FIG. 3 schematically illustrates an interface board integrated in FIG. 1.
Figure 4:
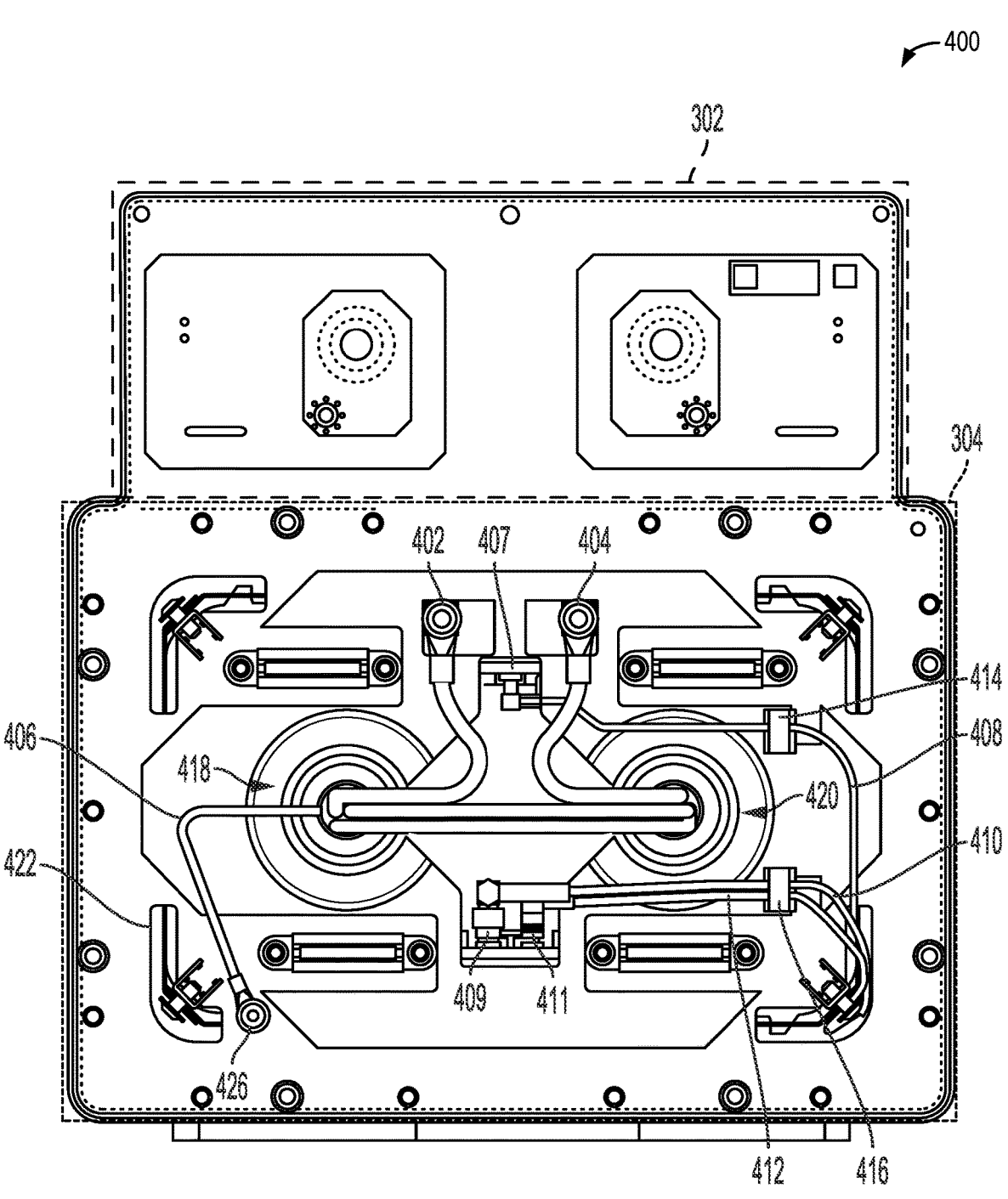
FIG. 4 schematically illustrates the interface board of FIG. 3 connected to other components of the high voltage (HV) tank.
Figure 9:
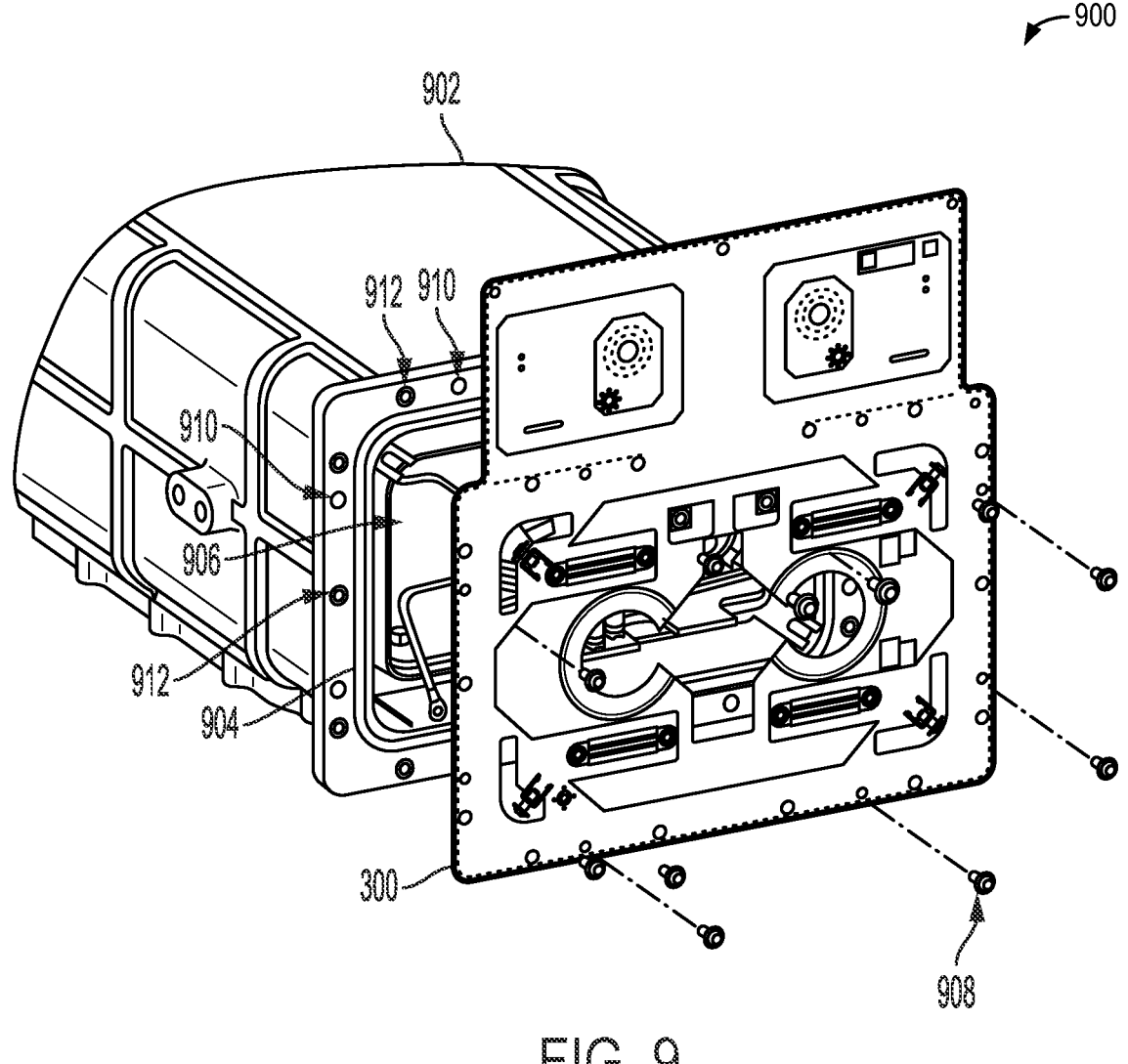
FIG. 9 schematically illustrates an assembly of the interface board and a tubular envelope of a HV tank.
Figure 10:
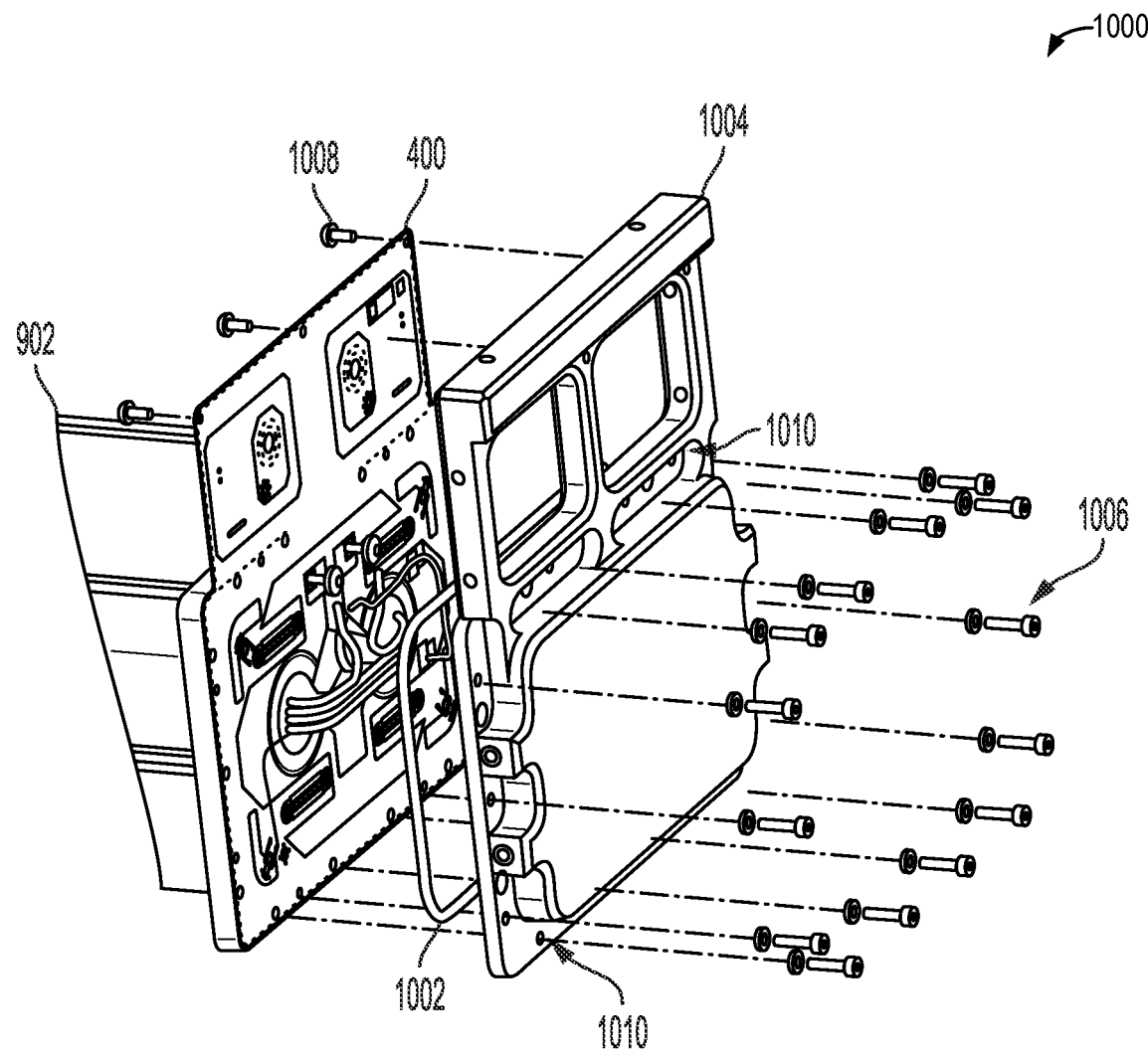
FIG. 10 schematically illustrates an assembly of the interface board and an end plate of the HV tank.
Figure 11:
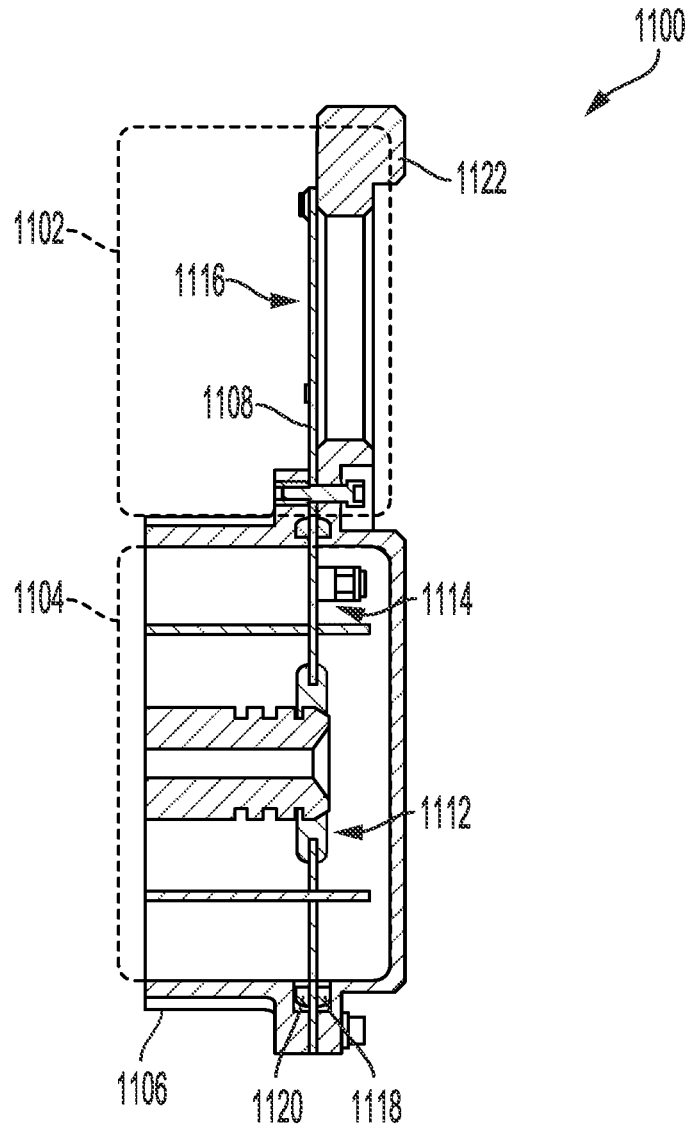
FIG. 11 shows a cross-section of a high voltage (HV) tank, according to embodiments of the present disclosure.
Figure 12:
FIG. 12 shows a sequence of layers that comprise an interface board.
Figure 13A:
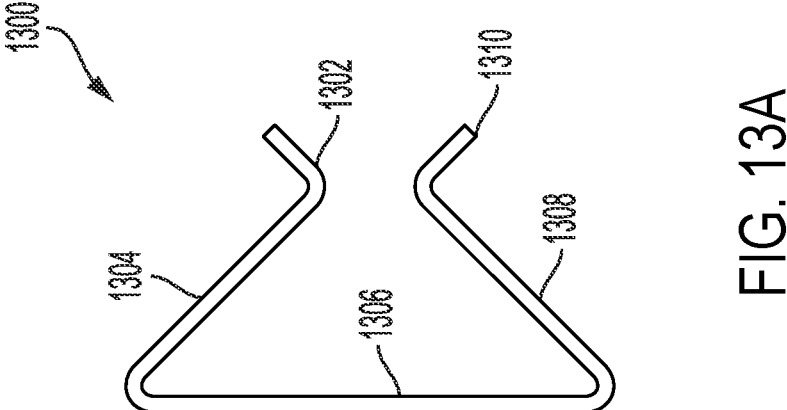
FIG. 13A, FIG. 13B, and FIG. 13C show different views of a grounding clip, according to embodiments of the present disclosure.
Figure 13B:
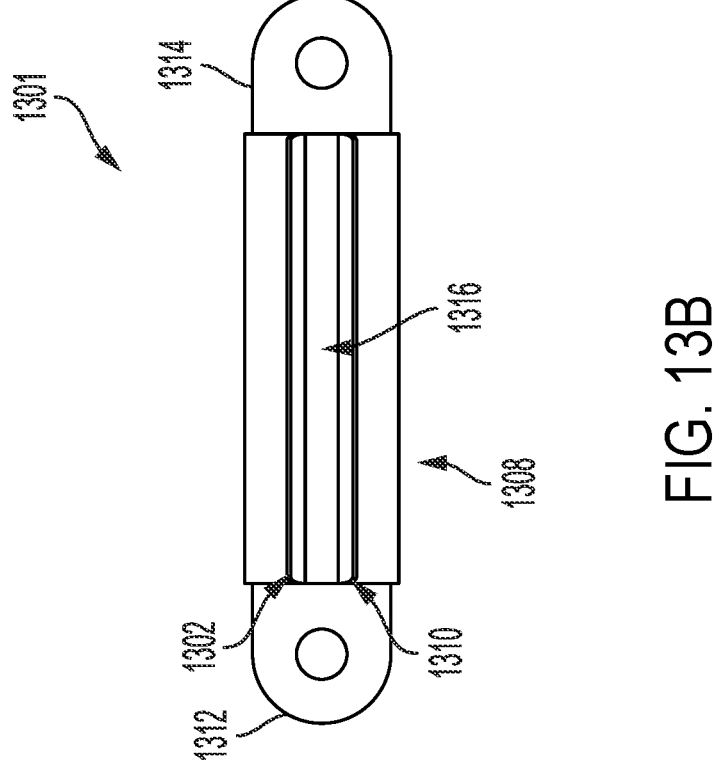
Figure 13C:
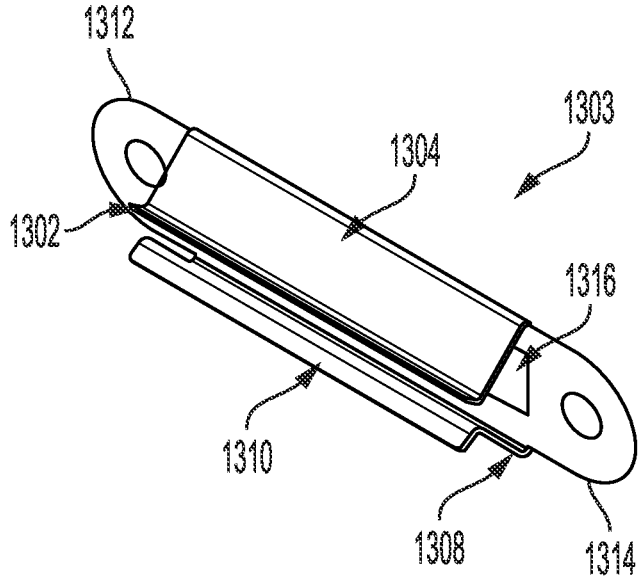

FIG. 1 depicts an x-ray generation and detection system wherein an interface board that acts as an electrical feedthrough circuit board is integrated therein. A high voltage (HV) tank is shown in FIG. 2. FIG. 3 shows an interface board, and FIG. 4 shows an interface board that is coupled to various components of a transformer assembly of the HV tank. FIGS. 5-8 illustrate a pair of outer signal layers and a pair of inner signal layers of the interface board. Assembly of a tubular envelope and the interface board of the HV tank is shown in FIG. 9. Assembly of the tubular envelope, the interface board, and the end plate of the HV is shown in FIG. 10. FIG. 11 shows a cross section of the HV tank. FIG. 12 illustrates the sequence of layers of the interface board. FIG. 13A-13C illustrate different view of a grounding clip integrated within the interface board. FIGS. 2-11 and 13A-13C are drawn to scale, although other relative dimensions may be used.

FIG. 1 illustrates an x-ray generation and detection system 100 configured for medical imaging. Particularly, the x-ray generation and detection system 100 is configured to generate and detect x-rays that may be used to image a subject, such as a patient, an inanimate object such as a phantom, one or more manufactured parts, and/or foreign objects such as dental implants, stents, and/or contrast agents present within the body.

In one embodiment, the x-ray generation and detection system 100 may include a high voltage (HV) generator 110. The HV generator 110 may comprise a power circuit 102 and a high voltage (HV) tank 104. The power circuit 102 is electrically coupled to the HV tank 104 and configured to supply power to the HV tank 104. The HV tank 104 may include an electrical feedthrough circuit board 108 electrically connected to a transformer assembly 106. The electrical feedthrough circuit board 108 may ground the transformer assembly and provide sealing of oil located within the HV tank 104 to ensure that oil remains on an oil side of the electrical feedthrough circuit board 108. The inner signal layers of the electrical feedthrough circuit board 108 enable power continuity of a power signal between the oil side and the air side of the electrical feedthrough circuit board. Split grommets located on the electrical feedthrough circuit board 108 mechanically dampen vibrations of the components of the transformer assembly 106. Embodiments of the HV tank 104 and the electrical feedthrough circuit board 108 are described further in FIGS. 2-11.

The power circuit 102 may receive electrical main power from a power distribution unit (PDU). In an example, the power circuit 102 may include a frequency converter which produces a high frequency input power signal to the transformer assembly 106. The power from the power circuit is delivered to the HV tank 104 and the transformer assembly 106 located therein via the electrical feedthrough circuit board 108. The transformer assembly 106 may generate the high voltage potentials desired by an x-ray tube 112 to generate x-rays. Particularly, in dual energy (DE) or multiple energy (ME) x-ray applications, the transformer assembly 106 are capable of generating multiple voltage levels across the x-ray tube 112. In this way, high voltage energy of the x-ray tube 112 may be between two or more output energy levels. More specifically, the HV generator 110 may convert the high voltage energy output from the transformer assembly 106 to a direct current (DC) high voltage.

The x-ray generation and detection system 100 may further include at least one x-ray tube 112 configured to project a beam of x-ray radiation for use in imaging the subject. Specifically, the x-ray tube 112 is configured to project the x-rays towards a detector array 120 via a collimator 118. Although FIG. 1 depicts a single x-ray tube 112, in certain embodiments, multiple x-ray radiation sources and detectors may be employed to project a plurality of x-rays for acquiring, for example, at different energy levels corresponding to the patient.

The x-ray tube 112 generally includes a cathode 114 and an anode 116. The cathode 114 and anode 116 are arranged in a generally opposing alignment along a longitudinal axis of the x-ray tube 112. The cathode 114 includes an electron-emitting filament that is capable in a conventional manner of emitting electrons. A filament heating current controls the number of electrons boiled off by the filament and thus provides control of the tube current flow. The high voltage potential applied by the HV tank 104 causes acceleration of the electrons from the cathode 114 towards the anode 116. The accelerated electrons collide with the anode 116, producing electromagnetic radiation, including x-ray radiation.

The HV tank 104 may be configured to receive an AC waveform from the power circuit 102 and condition the AC wave form to provide a high voltage DC potential to the x-ray tube 112 where the anode 116 and the cathode 114 usually carry equal voltages of different polarity. More specifically, the transformer assembly 106 of the HV tank 104 conditions the AC voltage signal transferred by the power circuit 102.

The x-ray tube 112 emits a cone-shaped beam which is collimated to lie within a plane of an X-Y-Z Cartesian coordinate system and generally referred to as an "imaging plane." The radiation beam passes through an object being imaged, such as the patient or subject. The beam, after being attenuated by the object, impinges upon the detector array 120 comprising radiation detectors. The intensity of the attenuated radiation beam received at the detector array 120 is dependent upon the attenuation of the radiation beam by the object. Each detector element of the array produces a separate electrical signal that is a measurement of the beam attenuation of a ray path between the source and the detector element. The attenuation measurements from all the detector elements are acquired separately to produce a transmission profile.

The detector array 120 further includes a plurality of detector elements that together sense the x-ray beams that pass through the subject (such as a patient) to acquire corresponding projection data. As the x-ray tube 112 and the detector array 120 rotate, the detector array 120 collects data of the attenuated x-ray beams. A collimator 118 comprising a plurality of collimator plates may be positioned on a detection side of the detector elements between the subject and the detector array 120. The collimator 118 is used to manage the x-ray beams by either focusing the x-ray tube 112 into a parallel beam that may be directed onto an area of interest or absorbing and attenuating scattered x-ray beams once they have emerged from the subject.

A high voltage (HV) tank 200 is depicted in FIG. 2. The high voltage (HV) tank may include a tubular envelope 202, an interface board 204, and a low voltage (LV) end plate 206. The tubular envelope 202 may enclose the various electrical components of a HV transformer assembly, including primary windings, secondary windings, insulation bars, and the like. The remaining inner space of the tubular envelope 202 may be filled with dielectric oil. The interface board 204 may be positioned at one end of the tubular envelope 202 of the HV tank 200. The interface board 204 may be a printed circuit board that acts as an electrical feedthrough circuit board of the HV tank. The interface board 204 may provide electrical signal transmission between an oil side of the interface board 204 in contact with the insulating oil, and an air side of the interface board 204. The interface board 204 may be an embodiment of the electrical feedthrough circuit board 108 of FIG. 1. The various components of the interface board 204 are described below in FIG. 3. A plurality of fasteners 208 may couple the tubular envelope 202, the interface board 204, and the LV end plate 206.

FIG. 3 shows an electrical feedthrough circuit board 300 integrated within a high voltage (HV) tank. The electrical feedthrough circuit board 300 may be an embodiment of the interface board 204 described above in FIG. 1. The electrical feedthrough circuit board 300 includes an air side 302 and an oil side 304. The air side 302 may be rectangular in shape with rounded edges and the oil side 304 may also be rectangular in shape with rounded edges. The air side 302 and the oil side 304 may be contiguous along a length of each the air side 302 and the oil side 304. The length of the air side 302 may be smaller than the length of the oil side 304, and a width of the air side 302 may be smaller than a width of the oil side 304. Additionally, a center of the air side 302 being aligned with a center of the oil side 304. The oil side 304 may be in contact with dielectric oil. The oil side 304 includes a plurality of grounding clips, such as a first grounding clip 306, a second grounding clip 308, a third grounding clip 310, and a fourth grounding clip 312, that electrically couple the electrical feedthrough circuit board 300 to the transformer boards assembly (not shown), and a pair of primary windings connection terminals, such as a first primary connection terminal 314 and a second primary connection terminal 316, for the connection of the electrical feedthrough circuit board to the primary windings.

The oil side 304 further includes a plurality of flanged screws, such as a first flanged screw 318, a second flanged screw 320, a third flanged screw 322, and a fourth flanged screw 324, that electrically couple the electrical feedthrough circuit board 300 with tile supports 422 of the HV tank (not shown), and a pair of split grommets, such as a first split grommet 336 and a second split grommet 338, that at least partially surround insulation bars of a HV transformer assembly (not shown) to support the insulation bars and provide mechanical dampening of the insulation bars. In one example, the plurality of flanged screws may electrically couple the electrical feedthrough circuit board 300 to the tile supports 422 via four-pin screw terminals.

In an example, the electrical feedthrough circuit board 300 may include a cavity 334 positioned near a center region of the oil side 304. The cavity 334 provides clearance for assembly and allows for various components of the HV tank to extend through the electrical feedthrough circuit board 300. The cavity 334 includes an oblique square-shaped portion 348, a first circular portion 344, a second circular portion 346, a first rounded rectangular-shaped portion 350, and a second rounded rectangular-shaped portion 352. The oblique square-shaped portion 348 is positioned substantially in a center of the oil side 304 of the electrical feedthrough circuit board 300. In other words, the oblique square-shaped portion 348 is positioned at an origin of the axis 351. The first circular portion 344 is positioned to the left of the oblique square-shaped portion 348 and the second circular portion 346 is positioned to the right of the oblique square-shaped portion when viewed from a first side of the electrical feedthrough circuit board facing an end plate of the HV tank. The first rounded rectangular-shaped portion 350 is positioned below the oblique square-shaped portion 348 farther from the air side 302 and the second rounded rectangular-shaped portion 352 is positioned above the oblique square-shaped portion closer to the air side 302.

The first rounded rectangular-shaped portion 350 and the second rounded rectangular-shaped portion 352 may be different sizes. In one example, the first rounded rectangular-shaped portion 350 is greater in length and width than the second rounded rectangular-shaped portion 352. One corner of the oblique square-shaped portion 348 that is aligned with the y-axis intersects the first circular portion 344 and another vertically-positioned corner of the oblique square-shaped portion that is also aligned with the y-axis intersects the second circular portion 346. One corner of the oblique square-shaped portion that is aligned with the x-axis intersects the first rounded rectangular-shaped portion 350 and another horizontally-positioned corner of the oblique square-shaped portion that is also aligned with the x-axis intersects the second rounded rectangular-shaped portion 352. It may be understood that the configuration of the cavity 334 is exemplary and may deviate from described herein without departing from the scope of the present disclosure. For example, the cavity may be differently shaped than as described herein so long as the cavity 334 has sufficient clearance for assembly of the electrical feedthrough circuit board 300.

The electrical feedthrough circuit board 300 may include a first split grommet 336 and a second split grommet 338 that are arranged in the cavity 334. More specifically, the first split grommet 336 is arranged within a first circular portion 344 of the cavity 334 and the second split grommet 338 is arranged within the second circular portion 346 of the cavity 334. Each of the first split grommet 336 and the second split grommet 338 is generally annular-shaped with an annular wedge removed on one side of the respective split grommet. The annular wedge removed from the first split grommet 336 corresponds substantially to the intersection between the oblique square-shaped portion 348 and the first circular portion 344. Similarly, the annular wedge removed from the second split grommet 338 corresponds substantially to the intersection between the oblique square-shaped portion 348 and the second circular portion 346. In this way, during assembly of the electrical feedthrough circuit board 300, primary windings may extend through the electrical feedthrough circuit board 300. The configuration of the split grommets may differ without departing from the scope of the present disclosure. For example, the portion removed from the grommet may differ so long as there is sufficient clearance for the primary windings.

The plurality of grounding clips may be positioned above and below the first split grommet 336 and the second split grommet 338. More specifically, a first grounding clip 306 may be positioned above and a third grounding clip 310 may be positioned below the first split grommet 336. Similarly, a second grounding clip 308 may be positioned above and a fourth grounding clip 312 may be positioned below the second split grommet 338. There may be sufficient space between the first split grommet 336 and the second split grommet 338 and the plurality of grounding clips such that none of the grounding clips touch either of the first split grommet or the second split grommet.

Turning to FIGS. 13A-13C, different views of a grounding clip are depicted. Each of the grounding clips may be generally stadium-shaped with a rectangular slot in a center region that extends a portion of a length of the respective grounding clip. Each of the grounding clips comprise a first surface that is directly coupled to the electrical feedthrough circuit board 300 via a fastener on one end of the respective grounding clip and another fastener on another end of the respective grounding clip, and two angled surfaces. The two angled surfaces extend from opposite longitudinal edges of the respective grounding clip and are inclined towards each other. In an assembled state, the configuration of the two angled surfaces and the rectangular slot enables the grounding clip to be electrically connected to the transformer boards assembly. In particular, a component of the transformer assembly may extend through a cut out in the first surface of the grounding clip and may be in contact with each of the two angled surfaces. The grounding clips may be used to couple parts of the transformer boards to the ground, in particular the shielding of the coaxial signal cables.

A side view 1300 of a grounding clip is shown in FIG. 13A. The grounding clip includes a first angled surface 1304 and a second angled surface 1308 that extends from a first surface 1306 that is directly coupled to the electrical feedthrough circuit board 300 as described herein. The first angled surface 1304 extends from one longitudinal edge of the first surface 1306 and the second angled surface 1308 extends from the opposite longitudinal edge of the first surface 1306 and the first angled surface and the second angled surface are inclined towards each other. The first angled surface 1304 and the second angled surface 1308 include a first angled end 1302 and a second angled end 1310, respectively, at an end opposite from the respective longitudinal edges wherein the angled surfaces extend from. The first angled end 1302 and the second angled end 1310 are inclined away from each other such that the angle between the first angled surface 1304 and the first angled end 1302 and the angle between the second angled surface 1308 and the second angled end 1310 is approximately 90°.

A front view 1301 of the grounding clip is shown in FIG. 13B. As described herein, the first surface 1306 of the grounding clip is generally stadium shaped. Each of a first rounded end 1312 and a second rounded end 1314 of the grounding clip includes a couple hole wherein the grounding clip may be coupled to the electrical feedthrough circuit board 300. The first rounded end 1312 is spaced apart from the second rounded end 1314 by a rectangular slot 1316. A length of the first angled surface 1304 and the first angled end 1302 extends from one end of the rectangular slot 1316 to another end of the rectangular slot. Similarly, a length of the second angled surface 1308 and a second angled end 1310 extends from one end of the rectangular slot 1316 to another end of the rectangular slot. An isometric view 1303 of the grounding clip is shown in FIG. 13C. The first angled surface 1304 and the second angled surface 1308 are angled such that the angle between the first surface 1306 and each of the first angled surface 1304 and the second angled surface 1308 is less than 90°.

Returning to FIG. 3, the electrical feedthrough circuit board 300 may also include a first primary connection terminal 314 and a second primary connection terminal 316. The first primary connection terminal 314 and the second primary connection terminal 316 are positioned above the cavity 334 and between the first grounding clip 306 and the second grounding clip 308. There may be sufficient space between the first primary connection terminal 314 and the second primary connection terminal 316 and each of the first grounding clip 306, the second grounding clip 308, and the cavity 334 such that neither of the first primary connection terminal 314 and the second primary connection terminal 316 touch the first grounding clip, the second grounding clip, or the cavity.

The electrical feedthrough circuit board 300 also includes a plurality of arch-shaped slots that are spaced apart from and aligned with corners of the oil side 304. Each arch-shaped slot is positioned near a respective corner of the oil side 304. More specifically, a first arch-shaped slot 326 is spaced apart from a first corner of the oil side 304 closest to the first grounding clip 306 and aligned with the first corner, a second arch-shaped slot 328 is spaced apart from a second corner of the oil side 304 closest to the second grounding clip 308 and aligned with the second corner, a third arch-shaped slot 330 is spaced apart from a third corner of the oil side 304 closest to the third grounding clip 310 and aligned with the third corner, and a fourth arch-shaped slot 332 is spaced apart from a fourth corner of the oil side 304 closest to the fourth grounding clip 312 and aligned with the fourth corner.

The plurality of flanged screws may be arranged near each of the plurality of arch-shaped slots wherein the respective prongs of the tile support 422 are positioned. In particular, a first flanged screw 318 may be arranged near the first arch-shaped slot 326 such that the first flanged screw 318 electrically connects a first prong of a tile support 422 of the HV tank (not shown) to the electrical feedthrough circuit board 300 via a four-pin screw terminal when the first prong is inserted into the first arch-shaped slot 326 and in contact with the first flanged screw 318. A second flanged screw 320, third flanged screw 322, and fourth flanged screw 324 may similarly electrically connect other prongs of the tile supports 422 inserted into the second arch-shaped slot 328, the third arch-shaped slot 330, and the fourth arch-shaped slot 332, respectively.

The electrical feedthrough circuit board 300 also includes a first plurality of couple holes 340 that are positioned around a perimeter of the oil side 304 of the electrical feedthrough circuit board 300 and on a top of the air side 302 of the electrical feedthrough circuit board 300. A first plurality of fasteners may extend from a low voltage (LV) end plate through the first plurality of couple holes 340 to couple the LV end plate and the electrical feedthrough circuit board 300, as shown in FIG. 10.

The electrical feedthrough circuit board 300 also includes a second plurality of couple holes 342 that are positioned around a perimeter of the oil side 304, as shown below in FIG. 9. A second plurality of fasteners may extend from the second plurality of couple holes 342 to a tubular envelope of the HV tank to couple the tubular envelope and the electrical feedthrough circuit board.

FIG. 4 shows an electrical feedthrough circuit board 400 coupled to electronic components of a high voltage (HV) transformer assembly arranged within a high voltage (HV) tank. The electrical feedthrough circuit board 400 may be an embodiment of the interface board 204 and 300 described above in FIGS. 1 and 3. Elements of the electrical feedthrough circuit board 400 that share at least some of the structural function and functional features with the electrical feedthrough circuit boards described above in FIGS. 1 and 3 may not be reintroduced, for brevity, including the air side 302 and the oil side 304.

The electrical feedthrough circuit board 400 includes a first primary connection 402 that is surrounded and positioned by a first primary connection terminal 314 and a second primary connection 404 that is surrounded and positioned by a second primary connection terminal 316. The first primary connection 402 may extend from a first primary connection of a HV transformer assembly arranged within the HV tank through a space between the first insulation bar 418 to the first primary connection 402. The second primary connection 404 may extend from a second primary connection of the HV transformer assembly arranged within the HV tank through a space between the second insulation bar 420 to the second primary connection 404. As depicted herein, the first split grommet 336 surrounds the first insulation bar 418 and the second split grommet 338 surrounds the second insulation bar 420 to mechanically dampen vibrations of the first insulation bar and the second insulation bar. The first insulation bar 418 and the second insulation bar 420 may be fabricated from a polypropylene material.

A screen wire 406 may be welded to a screen tube within the first insulation bar 418. The screen tube may be fabricated from brass. The screen wire 406 may connect to a ground 426 of the electrical feedthrough circuit board 400 to couple the screen tube and the electrical feedthrough circuit board. A first coaxial measure cable 408, a second coaxial measure cable 410, and a third coaxial measure cable 412 are clamped to the electrical feedthrough circuit board 400.

The first coaxial measure cable 408 extends through a cut-out in the electrical feedthrough circuit board 400 to a first component 407 extending through a cavity 334 of the electrical feedthrough circuit board. A first wire saddle clamp 414 clamps the first coaxial measure cable 408 to a first surface of the electrical feedthrough circuit board 400. The second coaxial measure cable 410 and the third coaxial measure cable 412 extend through the cut-out in the electrical feedthrough circuit board 400 to a second component 409 and a third component 411, respectively, extending through the cavity 334 of the electrical feedthrough circuit board. A second wire saddle clamp 416 clamps the second coaxial measure cable 410 and the third coaxial measure cable 412 to the first surface of the electrical feedthrough circuit board 400. The first coaxial measure cable 408, the second coaxial measure cable 410, and the third coaxial measure cable 412 connect to the transformer boards assembly.

Figure 5:
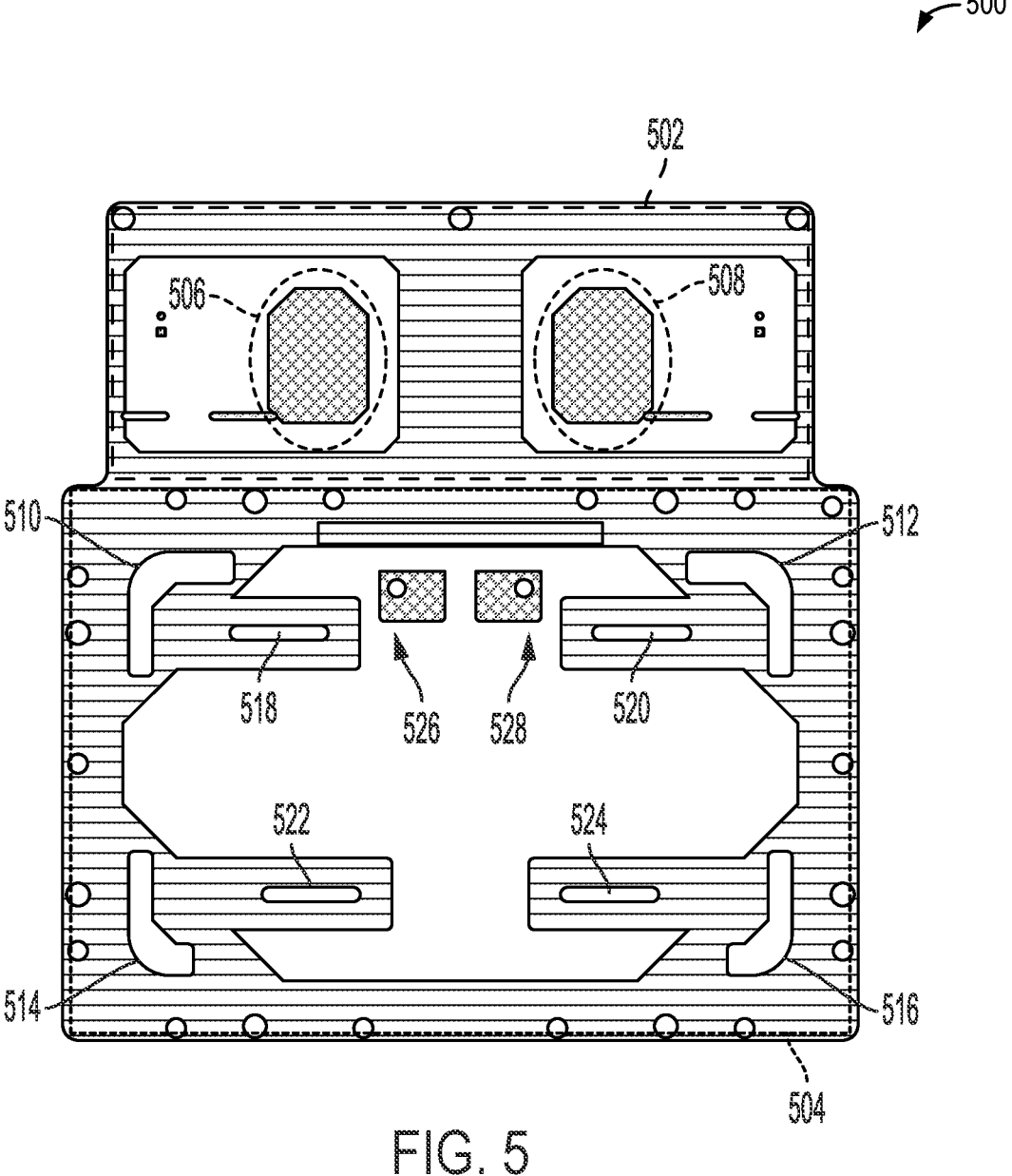
FIG. 5 schematically illustrates a first signal layer of the interface board of FIG. 1.
Figure 6:
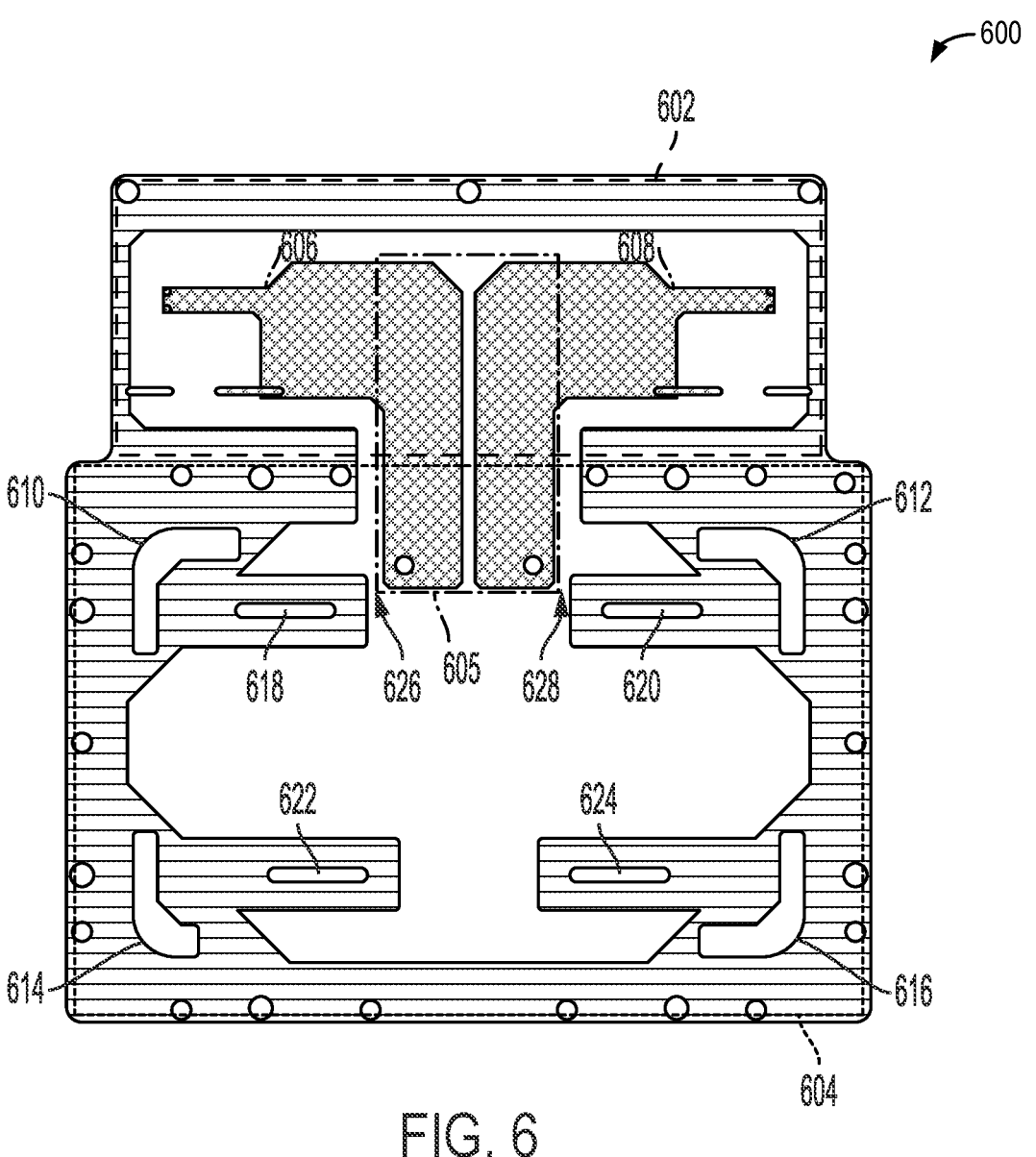
FIG. 6 schematically illustrates a second signal layer of the interface board of FIG. 1.
Figure 7:
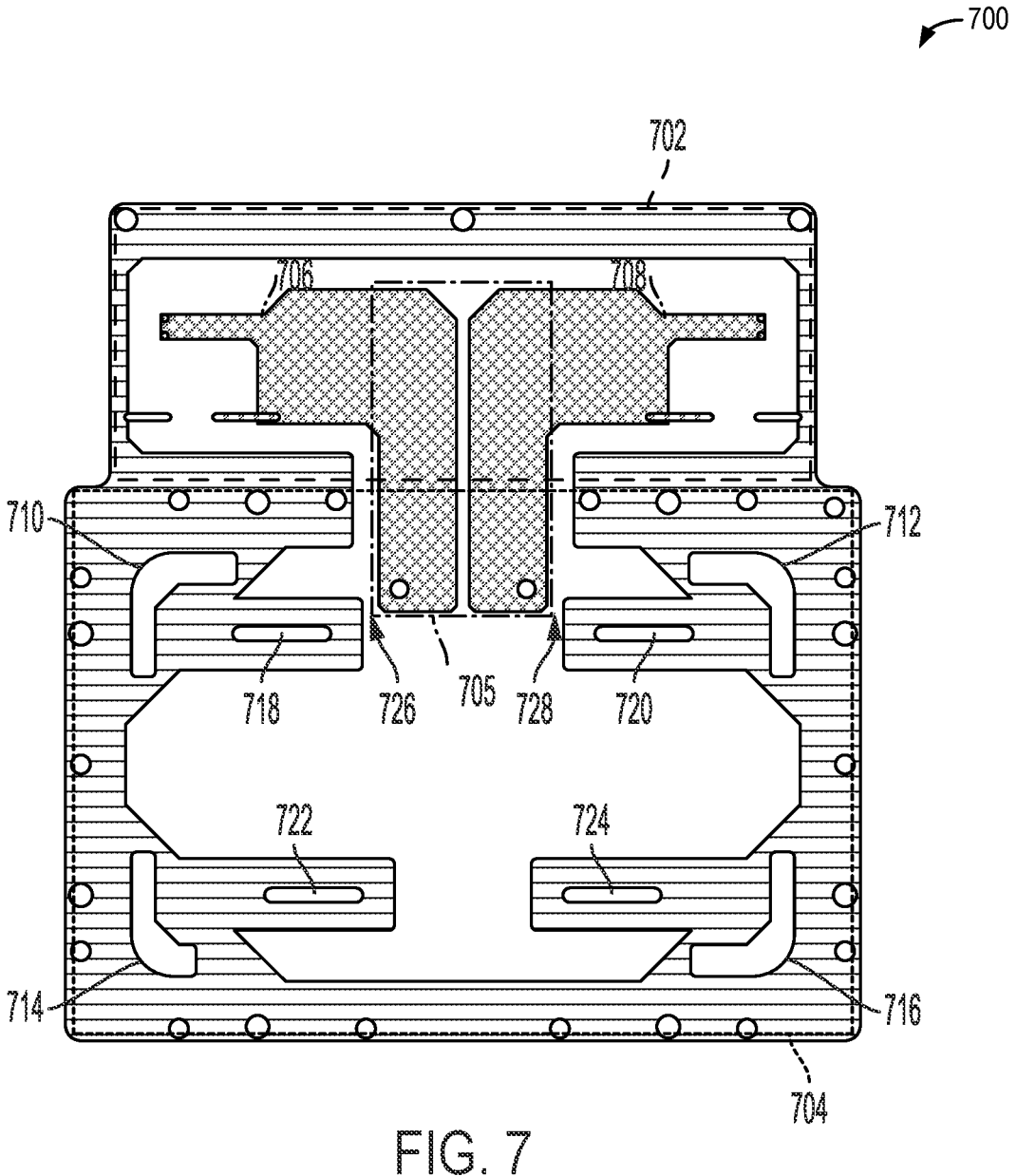
FIG. 7 schematically illustrates a third signal layer of the interface board of FIG. 1.
Figure 8:
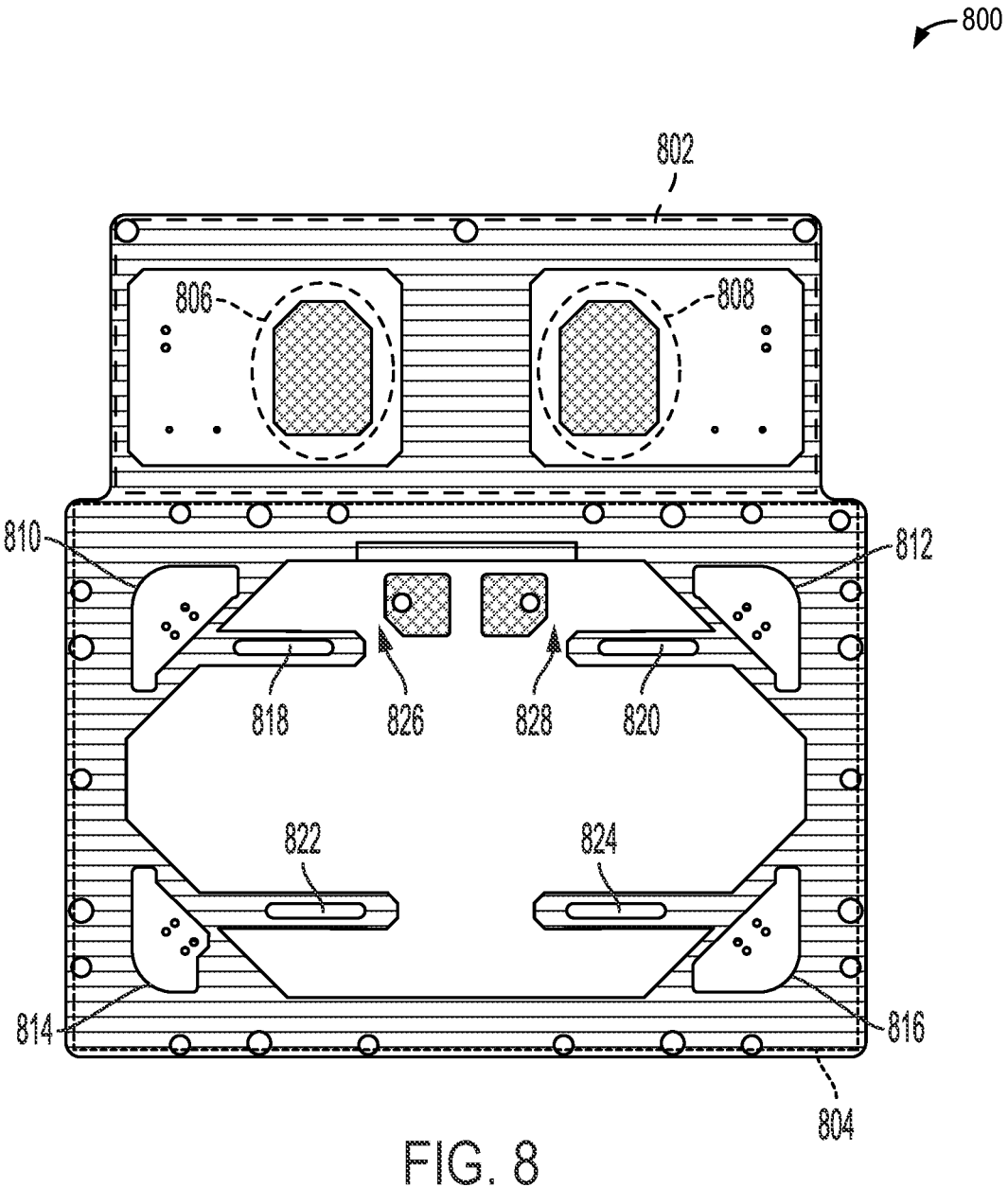
FIG. 8 schematically illustrates a bottom layer of the interface board of FIG. 1.

FIGS. 5-8 depict a pair of outer signal layers and a pair of inner signal layers of an electrical feedthrough circuit board, which may be an embodiment of the electrical feedthrough circuit boards described herein with respect to FIGS. 1-4. The electrical feedthrough circuit board includes a pair of outer signal layers, as shown in FIGS. 5 and 8, and a pair of inner signal layers, as shown in FIGS. 6 and 7, wherein the pair of inner signal layer electrically couples an air side of the electrical feedthrough circuit board and an oil side of the electrical feedthrough circuit board. The two inner signal layers electrically couple the air side and the oil side at a medial region of the electrical feedthrough circuit board. The first signal layer 500, the second signal layer 600, the third signal layer 700, and the fourth signal layer 800 of the electrical feedthrough circuit board may be configured with copper (e.g., demarcated by the shaded regions) and may be approximately 70 μm in thickness.

A ground plane of the first signal layer 500, the second signal layer 600, the third signal layer 700, and the fourth signal layer 800 is demarcated by horizontal line pattern. A primary winding connection or power plane of the first signal layer, the second signal layer 600, the third signal layer 700, and the fourth signal layer 800 is demarcated by a grid pattern.

Turning to FIG. 12, a sequence 1200 of layers that comprise an electrical feedthrough circuit board is shown. The sequence 1200 of layers includes a first silkscreen layer 1202, a first signal layer 1206, a first dielectric layer 1208, a second dielectric layer 1210, a second signal layer 1212, a core layer 1214, a third signal layer 1216, a third dielectric layer 1218, a fourth dielectric layer 1220, a fourth signal layer 1222, and a second silkscreen layer 1226. Each of the first dielectric layer 1208, the second dielectric layer 1210, the core layer 1214, the third dielectric layer 1218, and the fourth dielectric layer 1220 may be impregnated with a resin, such as a fiber epoxy resin, for example. The fiber epoxy resin may be a FR-4 lead free epoxy laminate and prepreg system with a high glass transition temperature (e.g., $T_g$ of around 170-180° C.), and high electric strength (e.g., electric strength of greater than 30 kV/mm for thickness less than 0.5 mm).

The first silkscreen layer 1202 may be a top layer of the electrical feedthrough circuit board, which may be in face-sharing contact with the first signal layer 1206. The first dielectric layer 1208 may be in face-sharing contact with the first signal layer 1206 and the second dielectric layer 1210 on opposing faces. The second dielectric layer 1210 may be in face-sharing contact with the second signal layer 1212 and the first dielectric layer 1208 on opposing faces. In this way, the first dielectric layer 1208 and the second dielectric layer 1210 may separate the first signal layer 1206 from the second signal layer 1212 such that the first signal layer 1206 is positioned apart from the second signal layer 1212. The first dielectric layer 1208 and the second dielectric layer 1210 may be fiber epoxy resin and may together be approximately 1000 μm in thickness.

The second signal layer 1212 and the third signal layer 1216 may be in face-sharing contact with opposing faces of the core layer 1214 such that the core layer 1214 may separate the second signal layer 1212 from the third signal layer 1216. The core layer may be fiber epoxy resin and may be approximately 130 μm in thickness.

The third dielectric layer 1218 may be in face-sharing contact with the third signal layer 1216 and the fourth dielectric layer 1220 on opposing faces. The fourth dielectric layer 1220 may be in face-sharing contact with the third dielectric layer 1218 and the fourth signal layer 1222 on opposing faces. In this way, the third dielectric layer 1218 and the fourth dielectric layer 1220 may separate the third signal layer 1216 from the fourth signal layer 1222 such that the third signal layer 1216 is positioned apart from the fourth signal layer 1222. The third dielectric layer 1218 and the fourth dielectric layer 1220 may be fiber epoxy resin and may together be approximately 1000 μm in thickness.

The second silkscreen layer 1226 may be a bottom layer of the electrical feedthrough circuit board that is in face-sharing contact with the fourth signal layer 1222.

Returning to FIG. 5, a first signal layer 500 of an interface board is illustrated in FIG. 5. The interface board may be an embodiment of the interface boards of FIGS. 2-4. The first signal layer 500 of the interface board is one of the pair of outer signal layers of the electrical feedthrough circuit board. The first signal layer 500 includes an air side 502 and an oil side 504. The first signal layer 500 is contiguous with a second signal layer 600 of the interface board described below. The first signal layer 500 includes a first air-side primary connection terminal 506 and a second air-side primary connection terminal 508 for a potential signal of resonant current from resonant circuit. The first signal layer 500 also includes a first oil-side primary connection terminal 526 and a second oil-side primary connection terminal 528. The first signal layer 500 is configured with a plurality of regions that when arranged with the other layers of the interface board define the plurality of arch-shaped slots, the rectangular slots of the plurality of grounding clips, slots for the pair of primary connection terminals, etc. as described above. In an example, the plurality of regions may include a first region 510, a second region 512, a third region 514, a fourth region 516, a fifth region 518, a sixth region 520, a seventh region 522, and an eighth region 524. The first region 510, the second region 512, the third region 514, and the fourth region 516 may correspond to the first arch-shaped slot, the second arch-shaped slot, the third arch-shaped slot, and the fourth arch-shaped slot, respectively.

The fifth region 518, the sixth region 520, the seventh region 522, and the eighth region 524 may correspond to a rectangular slot wherein a first grounding clip, a second grounding clip, a third grounding clip, and a fourth grounding clip are positioned, respectively. The first oil-side primary connection terminal 526 and the second oil-side primary connection terminal 528 may correspond to the locations wherein first primary connection terminal and the second primary connection terminal are positioned.

The second signal layer 600 of an interface board is illustrated in FIG. 6. The interface board may be an embodiment of the interface boards of FIGS. 2-4. The second signal layer 600 of the interface board is an inner signal layer of the interface board. The second signal layer 600 includes an air side 602 and an oil side 604. The second signal layer 600 is spaced between and contiguous with both of the first signal layer 500 and a third signal layer 700. The second signal layer 600 includes a continuity region 605 for power continuity between oil and air, and a first air-side primary connection terminal 606 and a second air-side primary connection terminal 608 configured for power continuity of the power signal of the resonant current from resonant circuit.

The second signal layer 600 is configured with a plurality of regions that when arranged with the other layers of the interface board define the plurality of arch-shaped slots, the rectangular slots of the plurality of grounding clips, slots for the pair of primary connection terminals, etc. as described above. In an example, the plurality of regions may include a first region 610, a second region 612, a third region 614, a fourth region 616, a fifth region 618, a sixth region 620, a seventh region 622, an eighth region 624, a first oil-side primary connection terminal 626, and a second oil-side primary connection terminal 628. The first region 610, the second region 612, the third region 614, and the fourth region 616 may correspond to the first arch-shaped region, the second arch-shaped region, the third arch-shaped region, and the fourth arch-shaped region, respectively.

The fifth region 618, the sixth region 620, the seventh region 622, and the eighth region 624 may correspond to a rectangular region wherein a first grounding clip, a second grounding clip, a third grounding clip, and a fourth grounding clip are positioned, respectively. The first oil-side primary connection terminal 626 and the second oil-side primary connection terminal 628 may correspond to the locations wherein the first primary connection terminal and the second primary connection terminal are positioned.

The third signal layer 700 of an interface board is illustrated in FIG. 7. The interface board may be an embodiment of the interface boards of FIGS. 2-4. The third signal layer 700 of the interface board is an inner signal layer of the electrical feedthrough circuit board. The third signal layer 700 includes an air side 702 and an oil side 704. The third signal layer 700 is spaced between and contiguous with the second signal layer 600 and a fourth signal layer 800. The third signal layer 700 includes a continuity region 705 for power continuity between oil and air, a first air-side primary connection terminal 706, a second air-side primary connection terminal 708, a first oil-side primary connection terminal 726, and a second oil-side primary connection terminal 728 configured for power continuity between the high voltage primary circuit on the oil side 704 and the power signal of the resonant current from resonant circuit on the air side 702.

The third signal layer 700 is configured with a plurality of regions that when arranged with the other layers of the interface board define the plurality of arch-shaped slots, the rectangular slots of the plurality of grounding clips, slots for the pair of primary connection terminals, etc. as described above. In an example, the plurality of regions may include a first region 710, a second region 712, a third region 714, a fourth region 716, a fifth region 718, a sixth region 720, a seventh region 722, an eighth region 724. The first region 710, the second region 712, the third region 714, and the fourth region 716 may correspond to the first arch-shaped slot, the second arch-shaped slot, the third arch-shaped slot, and the fourth arch-shaped slot, respectively.

The fifth region 718, the sixth region 720, the seventh region 722, and the eighth region 724 may correspond to a rectangular slot wherein a first grounding clip, a second grounding clip, a third grounding clip, and a fourth grounding clip are positioned, respectively. The first oil-side primary connection terminal 726 and the second oil-side primary connection terminal 728 may correspond to the locations wherein the first primary connection terminal and the second primary connection terminal are positioned.

The fourth signal layer 800 of an interface board is illustrated in FIG. 8. The interface board may be an embodiment of the interface boards of FIGS. 2-4. The fourth signal layer 800 of the interface is one of the pair of outer signals layers of the electrical feedthrough circuit board. The fourth signal layer 800 includes an air side 802 and an oil side 804. The fourth signal layer 800 includes a first air-side primary connection terminal 806 for the potential signal of a resonant current from resonant circuit, a second air-side primary connection terminal 808 for the potential signal of the resonant current from resonant circuit, a first oil-side primary connection terminal 826, and a second oil-side primary connection terminal 828.

The fourth signal layer 800 is configured with a plurality of regions that when arranged with the other layers of the electrical feedthrough circuit board define the plurality of arch-shaped slots, the rectangular slots of the plurality of grounding clips, slots for the pair of primary connection components, etc. as described above. In an example, the plurality of regions may include a first region 810, a second region 812, a third region 814, a fourth region 816, a fifth region 818, a sixth region 820, a seventh region 822, and an eighth region 824. The first region 810, the second region 812, the third region 814, and the fourth region 816 may correspond to the first arch-shaped region, the second arch-shaped region, the third arch-shaped region, and the fourth arch-shaped region, respectively. The fifth region 818, the sixth region 820, the seventh region 822, and the eighth region 824 may correspond to a rectangular slot wherein a first grounding clip, a second grounding clip, a third grounding clip, and a fourth grounding clip are positioned, respectively. The first oil-side primary connection terminal 826 and the second oil-side primary connection terminal 828 may correspond to the locations wherein the first primary connection terminal and the second primary connection terminal are positioned.

When the first signal layer 500, the second signal layer 600, the third signal layer 700, and the fourth signal layer 800 of the electrical feedthrough circuit board are arranged with the other layers of the electrical feedthrough circuit board described in FIG. 12, a signal may be transmitted between the first signal layer 500 and the second signal layer 600 by plated through-holes and vias. Via conduction of an electrically conductive material arranged on each of the second signal layer 600 and the third signal layer 700, the signal may be transmitted between the oil side and air side of the second signal layer 600 and the third signal layer 700. The signal may be transmitted between the fourth signal layer 800 and the third signal layer 700 by plated through-holes and vias.

More specifically, the first air-side primary connection terminals 506, 806 of the first signal layer 500 and the fourth signal layer 800, respectively, are electrically coupled to the first oil-side primary connection terminals 526, 826 via the first oil-side primary connection terminals 626, 726 of the second signal layer 600 and the third signal layer 700, respectively. Similarly, the second air-side primary connection terminals 508, 808 of the first signal layer 500 and the fourth signal layer 800, respectively, are electrically coupled to the second oil-side primary connection terminals 528, 828 via the second oil-side primary connection terminals 628, 728 of the second signal layer 600 and the third signal layer 700, respectively. In this way, power continuity between the oil side and the air side may be achieved. Interface boards with such a configuration achieve reliable power continuity, reduce parasitic inductive connections, and may also allow for a compact footprint. In this way, HV tanks may be compact enough to be integrated within a HV cabinet or medical imaging system.

FIG. 9 illustrates an assembly 900 of a tubular envelope 902 of a HV tank and an electrical feedthrough circuit board 300. The tubular envelope 902 may be fabricated from a sand casted aluminum alloy. The tubular envelope 902 and the electrical feedthrough circuit board 300 may be embodiments of the tubular envelope 202 and the interface board 204 of FIG. 2. Additionally, the HV tank may be an embodiment of the HV tank 200 of FIG. 2. Elements of the electrical feedthrough circuit board 300 that share at least some of the structural function and functional features with the electrical feedthrough circuit boards described above in FIGS. 2-4 may not be reintroduced, for brevity.

The assembly 900 includes a tubular envelope 902 of the high voltage (HV) tank, a mechanical seal 904, a high voltage (HV) transformer assembly 906, the electrical feedthrough circuit board 300, and a second plurality of fasteners 908. The assembly 900 may be a configuration wherein the HV transformer assembly 906 is arranged within the tubular envelope 902 of the HV tank. The mechanical seal 904 is contiguous with and positioned between the electrical feedthrough circuit board 300 and the tubular envelope 902. More specifically, the mechanical seal 904 is positioned within a groove that is machined on a face of the tubular envelope 902. The second plurality of fasteners 908 may be flanged screws, such as flanged hexalobular socket button head screws, and may be configured to squeeze or to compress the mechanical seal 904 between the tubular envelope 902 and the electrical feedthrough circuit board 300.

The HV transformer assembly 906 of an x-ray generator may increase voltage supplied to an x-ray tube (not shown). The x-ray tube may include an anode and cathode, and when high voltage is supplied to the cathode by the HV transformer assembly 906, electrons are emitted and accelerate toward the anode. A sudden deceleration of the emitted electrons at the anode result in the production of x-ray beams.

More specifically, the HV transformer assembly 906 may be a step-up HV transformer assembly wherein the HV transformer assembly increases an input voltage to a higher output voltage. A primary winding of the HV transformer assembly 906 is coupled to a power supply of the HV transformer assembly 906 and receives the input voltage. When the primary winding is subjected to an alternating current (AC), a variable magnetic field is created. The variable magnetic field induces a higher voltage in a secondary winding in response to the varying magnetic field. The insulation bars of the HV transformer assembly electrically insulate the primary winding from the secondary winding. The secondary winding is coupled to the x-ray tube to deliver the high output voltage to the x-ray tube to enable production of x-ray beams.

As shown above in FIG. 4, electrical components of the HV transformer assembly 906 may be electrically coupled to the various components of the electrical feedthrough circuit board 300, such as the wire screen, primary connections, the insulation bars, etc. In this way, an output power signal from the transformer assembly may be transmitted to a pair of inner signal layers of the electrical feedthrough circuit board 300, as shown in FIGS. 5 and 6. Accordingly, the power signal may be transmitted from the oil side to the air side via the inner signal layers due to the power continuity achieved by the pair of inner signal layers. From the air side, the output power signal of the output voltage of HV transformer assembly may be transmitted to an x-ray tube to provide an increased voltage that may produce x-rays.

The assembly 900 includes a mechanical seal 904 that surrounds an internal edge of one end of the tubular envelope 902 and one side of the electrical feedthrough circuit board 300. The outer layers of the electrical feedthrough circuit board 300 are sufficiently metallized to enable a proper seal of the mechanical seal 904 that prevents oil leaks on the oil side of the electrical feedthrough circuit board. In particular, the top layer of the electrical feedthrough circuit board 300 is configured with sufficient surface roughness that allows the electrical feedthrough circuit board 300 to compress the mechanical seal 904 against the tubular envelope 902 to seal the oil side of the electrical feedthrough circuit board and contain oil within the tubular envelope on the oil side. The sufficient surface roughness may not exceed 32 micro-inches and the sealing surface may be free of pits, bumps, dents, scratches, metallic particles, cracks, and the like. As an example, the mechanical seal 904 may be an O-ring, a gasket, etc.

As described herein, the electrical feedthrough circuit board 300 includes a second plurality of couple holes 342 positioned around a perimeter of the oil side of the electrical feedthrough circuit board 300. The second plurality of fasteners 908 may extend through each of the second plurality of couple holes 342 to a second plurality of couples holes 912 positioned on a perimeter of a face of the tubular envelope 902. The second plurality of fasteners 908 cause compression of the mechanical seal 904 of the pair of mechanical seals by the electrical feedthrough circuit board 300 onto the tubular envelope 902. A first plurality of couple holes 910 may be positioned on the perimeter of the face of the tubular envelope 902 wherein a first plurality of fasteners described in FIG. 10 may extend through.

As an example, each of the electrical feedthrough circuit board 300 and the tubular envelope 902 may be configured with eight couple holes positioned around the perimeter of the oil side of the electrical feedthrough circuit board and the perimeter of the interior edge of the tubular envelope, respectively. Accordingly, a fastener may extend through each of the eight couple holes of the electrical feedthrough circuit board 300 and tubular envelope 902 to position the tile supports and couple the electrical feedthrough circuit board 300 and the tubular envelope 902. By coupling the electrical feedthrough circuit board 300 and the tubular envelope 902, the assembly 900 achieves a configuration wherein the second plurality of fasteners 908 may enable the mechanical seal 904 to be compressed, which may prevent leaks and maintain oil on the oil side of the electrical feedthrough circuit board 300, as described below in FIG. 10.

FIG. 10 illustrates an assembly 1000 of a low voltage (LV) end plate 1004 of a HV tank and the electrical feedthrough circuit board 400. The tubular envelope 902 and the electrical feedthrough circuit board 400 may be embodiments of the tubular envelope 202 and the interface board 204 of FIG. 2. Additionally, the HV tank may be an embodiment of the HV tank 200 of FIG. 2. The assembly 900 is included as part of the assembly 1000. Elements of the electrical feedthrough circuit board 300 that share at least some of the structural function and functional features with the electrical feedthrough circuit boards described above in FIGS. 2-4 and 9 may not be reintroduced, for brevity.

The assembly 1000 includes a tubular envelope 902 of the high voltage (HV) tank, a second mechanical seal 1002, the electrical feedthrough circuit board 400, a low voltage (LV) end plate 1004, a first plurality of fasteners 1006, and a third plurality of fasteners 1008. The second mechanical seal 1002 is contiguous with and positioned between a second side of the electrical feedthrough circuit board 400 and the LV end plate 1004. The mechanical seal 904 and the second mechanical seal 1002 may be positioned on opposing sides of the electrical feedthrough circuit board 400. The first plurality of fasteners 1006 may be flanged screws, such as flanged hexalobular socket button head screws, and may be configured to position the second mechanical seal 1002 and compress the second mechanical seal 1002 between the electrical feedthrough circuit board 400 and the LV end plate 1004 once the interface board is coupled to the tubular envelope by the second plurality of fasteners, compressing the mechanical seal 904. The third plurality of fasteners 1008 may be screws, such as hexagon socket head cap screws.

The assembly 1000 further includes a second mechanical seal 1002 that is positioned in a groove of the LV end plate 1004. The top layer of the electrical feedthrough circuit board 400 is sufficiently metallized to enable a proper alignment and sealing of the second mechanical seal 1002 that prevents oil leaks on the oil side of the electrical feedthrough circuit board. In particular, the top layer of the electrical feedthrough circuit board 400 is configured with sufficient surface roughness that allows the LV end plate 1004 to compress the second mechanical seal 1002 against the electrical feedthrough circuit board 400 which compresses against the mechanical seal 904 and the tubular envelope 902 to seal the oil side of the electrical feedthrough circuit board and contain oil within the tubular envelope on the oil side. The sufficient surface roughness may not exceed 32 micro-inches and the sealing surface may be free of pits, bumps, dents, scratches, metallic particles, cracks, and the like. In an example, the second mechanical seal 1002 may be an O-ring, a gasket, etc.

The LV end plate 1004 includes a plurality of through holes 1010 positioned around a perimeter of the LV end plate 1004. The first plurality of fasteners 1006 may extend through each through hole positioned around the perimeter of a bottom portion of the LV end plate 1004 through couple holes of the first plurality of couples holes 340 located around the perimeter of the oil side of the electrical feedthrough circuit board 400. The first plurality of fasteners 1006 may further extend from the first plurality of couples holes 340 of the electrical feedthrough circuit board 400 through a first plurality of couple holes 910 positioned around the perimeter of the face of the tubular envelope 902. A third plurality of fasteners 1008 may extend through each through hole at a top of the LV end plate 1004 through couple holes of the first plurality of couple holes 340 located at the top of the air side of the electrical feedthrough circuit board 400.

As an example, the electrical feedthrough circuit board 400 may be configured with fourteen couple holes that are positioned around the perimeter of the oil side of the electrical feedthrough circuit board and three couple holes that are positioned at a top of the air side of the electrical feedthrough circuit board. The aforementioned couple holes are included in the first plurality of couple holes 342 described above. The LV end plate 1004 may be configured with fourteen through holes positioned around the perimeter of the bottom portion of the LV end plate and three through holes positioned at the top of the LV end plate.

Accordingly, a fastener of the first plurality of fasteners 1006 may extend through each of the fourteen through holes of the LV end plate 1004 and through each of the fourteen couple holes of the electrical feedthrough circuit board 400 to couple the bottom of the electrical feedthrough circuit board 400 and the bottom of LV end plate 1004. The fastener of the first plurality of plurality of fasteners 1006 may further extend from each of the fourteen couples holes of the electrical feedthrough circuit board 400 through fourteen couples holes of the tubular envelope 902 to couple the bottom of the LV end plate and the bottom of the tubular envelope. A fastener of the third plurality of fasteners 1008 may extend through each of the three through holes located at the top of the LV end plate 1004 and through each of the three couple holes of the electrical feedthrough circuit board 400 to couple the top of the electrical feedthrough circuit board 400 and the top of the LV end plate 1004. By coupling the electrical feedthrough circuit board 400, the tubular envelope 902, and the LV end plate 1004 the assembly 1000 achieves a configuration wherein both of the mechanical seal 904 and the second mechanical seal 1002 are sufficiently compressed and enable proper sealing of the oil side of the electrical feedthrough circuit board 400.

FIG. 11 illustrates a cross section 1100 of an interior of a high voltage (HV) tank. The HV tank may be an embodiment of the HV tank 200 of FIG. 2 and the various components included in the HV tank may be embodiments of the components described herein with respect to FIGS. 2-10. The cross section 1100 includes a tubular envelope 1106, a printed circuit board (PCB) 1108 having an oil side 1104 and an air side 1102 arranged inside the HV tank and integrated with and coupled to a HV transformer assembly of the tubular envelope, a pair of O-rings arranged on either side of the PCB 1108, wherein the pair of O-rings, such as a first O-ring 1118 and a second O-ring 1120, surround the oil side of the PCB, and a low voltage (LV) end plate 1122. The PCB 1108 enables signal transmission from a primary connection 1114 on the oil side 1104 to a primary connection 1116 on the air side 1102. The tubular envelope 1106 and the LV end plate 1122 comprise an outer surface of the HV tank. The PCB 1108 is fastened to the tubular envelope 1106 and the LV end plate 1122 is fixed to the tubular envelope through the printed circuit board via fasteners, the fasteners compressing the O-rings to provide a mechanical seal.

The PCB 1108 is directly fixed to the tubular envelope 1106 via a second plurality of fasteners according to the embodiments described herein. The LV end plate 1122 is attached to the HV tank via the first plurality of fasteners according to the embodiments described herein. The first plurality of fasteners and third plurality of fasteners extend through the PCB in a fastened state and cause one O-ring, such as the first O-ring 1118, to be compressed. As described herein, the PCB 1108 includes a plurality of grounding clips on a first surface of the PCB wherein a respective grounding clip couples the transformer boards assembly to the PCB. Additionally, the PCB 1108 includes wire saddle clamps on the first surface of the PCB that clamp coaxial cables coupled to the transformer boards assembly. The PCB 1108 has a surface metallization on each side that provides a surface roughness compatible to seal the pair of O-rings to the PCB to each side of the PCB. The surface roughness may not exceed 32 micro-inches and the sealing surface may be free of pits, bumps, dents, scratches, metallic particles, cracks, and the like.

On one end of the HV tank opposite from the LV end plate 1122, the components of the HV tank are relatively fixed and little to no movement of the components is expected. In contrast, components of the HV tank positioned on the other end wherein the LV end plate 1122 is located has a capacity for considerable movement of the components, especially during transport of the HV tank. The HV tank is configured with split grommets to mechanically dampen movement of the components with the capacity for significant movement.

As depicted in the cross section 1100, a pair of split grommets, such as a first split grommet 1112, may be integrated within the PCB 1108 where the pair of split grommets arranged partially around a circumference of a pair of primary insulation bars, respectively. More specifically, the first split grommet 1112 is arranged partially around a circumference of a first primary insulation bar 1110 and the second split grommet partially surrounds a circumference of a second primary insulation bar. Each of the first primary insulation bar 1110 and the second primary insulation bar surround primary windings of the HV transformer assembly and electrically insulate primary windings from the secondary windings. The pair of split grommets may be fabricated from rubber.

The first split grommet 1112 and the second split grommet are strategically arranged within the HV tank to ensure that the HV tank does not vibrate excessively during, for example, transport of the HV tank. In fact, the first split grommet 1112 and the second split grommet tightly surround the first primary insulation bar 1110 and the second primary insulation bar, respectively, to ensure that the first primary insulation bar 1110 and the second primary insulation bar are secured. Additionally, the various components of the HV transformer assembly are configured with additional space (e.g., degree of freedom) to account for thermal expansion of the various components along the length of the HV transformer assembly.

The technical effect of integrating an interface board that acts as an electrical feedthrough circuit board into a high voltage (HV) tank for an x-ray generation and detection system is that oil is properly sealed within the HV tank, and thus, the electrical components of the HV tank are electrically insulated. Since the number of electrical components is reduced, the HV tank performs more efficiently, has a smaller footprint, and is more compact. Further, the overall manufacturing cost may be decreased. Because the air side and the oil side of the HV tank are electrically coupled in the printed circuit board and without electrical bulkheads, the HV tank may be more compact, enabling the HV tank to be in tight spaces such as an electrical cabinet or a computed tomography (CT) scanner.

Further, a shorter connection between the high voltage primary circuit of the HV tank and the resonant current from resonant circuit connection reduces parasitic inductive connections. Additionally, the interface ensures that power continuity of power signal is achieved while providing increased mechanical dampening to the electrical components of the HV tank. Since the electrical feedthrough board is electrically coupled to the transformer assembly of the HV tank, the electrical feedthrough board may ground various components of the transformer assembly by connecting the various components to wiring that is coupled to a ground of the interface board.

FIGS. 1-12 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

As used herein, an element or step recited in the singular and preceded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. An electrical feedthrough circuit board for a high voltage tank, comprising:

a pair of outer signal layers;

a pair of inner signal layers; wherein the pair of inner signal layers electrically connects an air side of the electrical feedthrough circuit board and an oil side of the electrical feedthrough circuit board, wherein the air side and the oil side are contiguous regions, and wherein both the air side and the oil side are on both faces of the electrical feedthrough circuit board.

2. The electrical feedthrough circuit board of claim 1, further comprising a grounding clip, wherein the grounding clip electrically connects the electrical feedthrough circuit board to a transformer boards assembly of the high voltage tank.

3. The electrical feedthrough circuit board of claim 2, further comprising a second grounding clip, a third grounding clip, and a fourth grounding clip, wherein the second grounding clip, the third grounding clip, and the fourth grounding clip electrically connect the electrical feedthrough circuit board to the transformer boards assembly of the high voltage tank.

4. The electrical feedthrough circuit board of claim 2, wherein the grounding clip comprises a first surface directly contacting the electrical feedthrough circuit board and two angled surfaces, wherein the two angled surfaces extend from opposite longitudinal edges and are inclined towards each other, and wherein, in an assembled state, the transformer boards assembly extends through the electrical feedthrough circuit board and a cut-out in the first surface of the grounding clip and contacts each of the two angled surfaces.

5. The electrical feedthrough circuit board of claim 1, further comprising a split grommet, wherein the split grommet is arranged partially around a circumference of a primary insulation bar of the high voltage tank.

6. The electrical feedthrough circuit board of claim 1, wherein the pair of outer signal layers and the pair of inner signal layers are made of copper, and wherein successive signal layers are separated by dielectric layers.

7. The electrical feedthrough circuit board of claim 1, wherein a first outer layer of the pair of outer layers is electrically connected to a first inner layer of the pair of inner layers by first plated through-holes and vias, and a second outer layer of the pair of outer layers is electrically connected to a second inner layer of the pair of inner layers by second plated through-holes and vias, and wherein an air-side primary connection terminal is electrically coupled to an oil-side primary connection terminal via the first plated through-holes and vias, an electrically conductive material arranged on each of the pair of inner layers spanning the oil side and the air side, and the second plated through-holes and vias.

8. The electrical feedthrough circuit board of claim 1, wherein the pair of inner signal layers electrically connects the air side and the oil side at a medial region of the electrical feedthrough circuit board without electrical bulkheads.

9. The electrical feedthrough circuit board of claim 1, wherein the electrical feedthrough circuit board has a surface metallization sufficient to seal the oil side via an O-ring.

10. A medical imaging device, comprising:
a tubular envelope of a high voltage tank;
a printed circuit board having an oil side and an air side arranged inside the high voltage tank, wherein the oil side and the air side are contiguous regions, and wherein both the oil side and the air side are on both faces of the printed circuit board;
a pair of mechanical seals arranged on opposing sides of the printed circuit board, wherein the pair of mechanical seals surround the oil side of the printed circuit board; and an end plate.

11. The medical imaging device of claim 10, wherein the printed circuit board is directly fixed to the tubular envelope via a second plurality of fasteners.

12. The medical imaging device of claim 11, wherein the second plurality of fasteners compresses a first mechanical seal of the pair of mechanical seals.

13. The medical imaging device of claim 12, wherein the end plate is attached to the high voltage tank via a first plurality of fasteners, wherein the first plurality of fasteners extends through the printed circuit board in a fastened state, and wherein the first plurality of fasteners causes a second mechanical seal of the pair of mechanical seals to be compressed.

14. The medical imaging device of claim 10, further comprising a grounding clip on a first surface of the printed circuit board, wherein the grounding clip electrically connects a transformer boards assembly to the printed circuit board.

15. The medical imaging device of claim 14, further comprising wire saddle clamps on the first surface of the printed circuit board, wherein the wire saddle clamps clamp coaxial cables connected to the transformer boards assembly to the first surface of the printed circuit board.

16. The medical imaging device of claim 10, wherein the printed circuit board has a surface metallization not exceeding 32 micro-inches.

17. A high voltage tank, comprising:
a pair of primary insulation bars;
a printed circuit board arranged inside a high voltage tank having both an oil side and an air side on each of a first face and a second face of the printed circuit board, wherein the oil side and the air side are contiguous regions on each of the first face and the second face of the printed circuit board;
a pair of O-rings arranged on either side of the printed circuit board, wherein a first O-ring of the pair of O-rings surrounds the oil side of the printed circuit board on the first face, and a second O-ring of the pair of O-rings surrounds the oil side of the printed circuit board on the second face;
an end plate; and
a tubular envelope;
wherein the end plate and the tubular envelope comprise an outer surface of the high voltage tank;
wherein the printed circuit board comprises a plurality of grounding clips coupled to the first face on the oil side and a pair of split grommets arranged around a circumference of the primary insulation bars;
wherein the printed circuit board comprises a plurality of layers, wherein the plurality of layers comprises two electrically conductive outer signal layers, two electrically conductive inner signal layers, and dielectric layers separating the outer signal layers and the inner signal layers, wherein the inner signal layers of the plurality of layers electrically connects the oil side and the air side of the printed circuit board;
wherein the printed circuit board has a surface metallization on each side, wherein the surface metallization on each side provides a surface roughness compatible to seal the pair of O-rings to each side of the printed circuit board.

18. The high voltage tank of claim 17, wherein the pair of split grommets are each shaped as an annular wedge and provide mechanical dampening to the primary insulation bars.

19. The high voltage tank of claim 18, wherein the pair of split grommets are rubber.

20. The high voltage tank of claim 17, wherein the printed circuit board is fastened to the tubular envelope, compressing the second O-ring between the tubular envelope and the second face, and wherein the end plate is fixed to the tubular envelope through the printed circuit board via fasteners; and wherein the fasteners compress the first O-ring between the first face and the end plate.

\* \* \* \* \*